US010659060B2

(12) United States Patent
Monk et al.

(10) Patent No.: US 10,659,060 B2
(45) Date of Patent: May 19, 2020

(54) SPUR CANCELLATION WITH ADAPTIVE FREQUENCY TRACKING

(71) Applicant: Silicon Laboratories Inc., Austin, TX (US)

(72) Inventors: Timothy A. Monk, Hudson, NH (US); Rajesh Thirugnanam, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/143,717

(22) Filed: Sep. 27, 2018

(65) Prior Publication Data
US 2020/0106451 A1    Apr. 2, 2020

(51) Int. Cl.
*H03L 7/091*    (2006.01)
*H03L 7/093*    (2006.01)
*G04F 10/00*    (2006.01)

(52) U.S. Cl.
CPC .............. *H03L 7/091* (2013.01); *H03L 7/093* (2013.01); *G04F 10/005* (2013.01)

(58) Field of Classification Search
CPC ........ H03L 7/091; H03L 7/093; G04F 10/005
See application file for complete search history.

(56) References Cited

U.S. PATENT DOCUMENTS

| 7,061,276 | B2 | 6/2006 | Xu |
| 7,064,616 | B2 | 6/2006 | Reichert |
| 7,208,990 | B1 | 4/2007 | Hassun |
| 7,391,839 | B2 | 6/2008 | Thompson |
| 7,605,662 | B2 | 10/2009 | Kobayashi et al. |
| 7,746,972 | B1 | 6/2010 | Melanson et al. |
| 8,207,766 | B2 | 6/2012 | Yu |
| 8,390,348 | B2 | 3/2013 | Burcea |
| 8,427,243 | B2 | 4/2013 | Chen et al. |
| 8,497,716 | B2 | 7/2013 | Zhang |
| 8,604,840 | B2 | 12/2013 | Ahmadi et al. |
| 8,947,139 | B1 | 2/2015 | Vercesi et al. |
| 8,957,712 | B2 | 2/2015 | Tang et al. |
| 9,071,195 | B2 | 6/2015 | Gabbay |
| 9,246,500 | B2 | 1/2016 | Perrott |
| 9,490,818 | B2 | 11/2016 | Perrott |
| 9,762,250 | B2 | 9/2017 | Perrott |
| 2008/0116946 | A1 | 5/2008 | Masson |
| 2008/0129352 | A1 | 6/2008 | Zhang |
| 2008/0218228 | A1 | 9/2008 | Masson |

(Continued)

OTHER PUBLICATIONS

Avivi, R., et al., "Adaptive Spur Cancellation Technique in All-Digital Phase-Locked Loops," IEEE Transactions on Circuits and Systems—II: Express Briefs, vol. 64, No. 11, Nov. 2017, pp. 1291-1996.

(Continued)

*Primary Examiner* — William Hernandez
(74) *Attorney, Agent, or Firm* — Zagorin Cave LLP

(57) ABSTRACT

A spur cancellation circuit receives a target spur frequency indicative of a frequency of a spur to be canceled and supplies a spur cancellation signal based on the frequency. A frequency tracking circuit tracks a change in the frequency of the spur to be canceled based on a change in phase of the spur cancellation signal and generates an updated target spur frequency based on the change in the frequency of the spur.

16 Claims, 4 Drawing Sheets

(56) References Cited

U.S. PATENT DOCUMENTS

| | | | |
|---|---|---|---|
| 2009/0132884 | A1 | 5/2009 | Suda et al. |
| 2009/0251225 | A1 | 10/2009 | Chen et al. |
| 2010/0097150 | A1 | 4/2010 | Ueda et al. |
| 2010/0213984 | A1 | 8/2010 | Shin et al. |
| 2011/0025388 | A1 | 2/2011 | Lamanna |
| 2011/0109356 | A1 | 5/2011 | Ali et al. |
| 2011/0133799 | A1 | 6/2011 | Dunworth et al. |
| 2011/0204938 | A1 | 8/2011 | Lamanna |
| 2012/0161832 | A1 | 6/2012 | Lee et al. |
| 2013/0050013 | A1 | 2/2013 | Kobayashi et al. |
| 2013/0112472 | A1 | 5/2013 | Welland |
| 2013/0222026 | A1 | 8/2013 | Havens |
| 2013/0257494 | A1 | 10/2013 | Nikaeen et al. |
| 2014/0077849 | A1 | 3/2014 | Chen et al. |
| 2014/0211899 | A1 | 7/2014 | Furudate |
| 2014/0266341 | A1 | 9/2014 | Jang et al. |
| 2015/0145571 | A1 | 5/2015 | Perrott |
| 2015/0207514 | A1 | 7/2015 | Kim et al. |
| 2015/0008961 | A1 | 8/2015 | Kim et al. |
| 2016/0112053 | A1 | 4/2016 | Perrott |
| 2016/0359493 | A1* | 12/2016 | Chen ............... H03L 7/099 |
| 2019/0068205 | A1 | 2/2019 | Tamura et al. |

OTHER PUBLICATIONS

Ho, C., and Chen, M., "A Fractional-N DPLL With Calibration-Free Multi-Phase Injection-Locked TDC and Adaptive Single-Tone Spur Cancellation Scheme," IEEE Transactions on Circuits and Systems—I: Regular Papers, vol. 63, No. 3, Aug. 2016, pp. 1111-1122.

Li, Y., et al., "On-Chip Spur and Phase Noise Cancellation Techniques," IEEE Asian Solid-State Circuits Conference, Nov. 6-8, 2017, pp. 109-112.

U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.

U.S. Appl. No. 16/018,598, entitled "Spur Cancellation for Spur Measurement," filed Jun. 26, 2018, by Timothy A. Monk and Rajesh Thirugnanam.

U.S. Appl. No. 16/143,711, entitled "Spur Canceller with Multiplier-Less Correlator," filed Sep. 27, 2018, by Timothy A. Monk and Rajesh Thirugnanam.

Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

Hedayati, H. et al., "A 1 MHz Bandwidth, 6 GHz 0.18 μm CMOS Type-I ΔΣ Franctional-N Synthesizer for WiMAX 4pplications," IEEE Journal of Solid State Circuits, vol. 44, No. 12, Dec. 2009, pp. 3244-3252.

Hedayati, H. and Bakkaloslu, B., "A 3GHz Wideband ΣΔ Fractional-N Synthesizer with Voltage-Mode Exponential CP-PFD", IEEE Radio Frequency Integrated Circuits Symposium, 2009, pp. 325-328.

Hsu, C.M. et al., "A Low-Noise Wide-BW 3.6-GHz Digital ΔΣ Fractional-N Frequency Synthesizer with a Noise-Time-to-Digital Converter and quantization Noise Cancellation," IEEE Journal of Solid-State Circuits, vol. 43, No. 12, Dec. 2008, pp. 2776-2786.

Menninger, S. and Perrott, M., "A 1-MHz Bandwidth 3.6-GHz 0.18μm CMOS Fractional-N Synthesizer Utilizing a Hybrid PFD/DAC Structure for Reduced Broadband Phase Noise," IEEE Journal of Solid-State Circuits, vol. 41, No. 1, Apr. 2006, pp. 966-980.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Staszewski, R.B. et al., "All-Digital PLL and Transmitter for Mobile Phones," IEEE Journal of Solid-State Circuits, vol. 40, No. 12, Dec. 2005, pp. 2469-2482.

Staszewski, R.B. et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.

Straayer, M.Z. and Perrott, M.H., A 12-Bit, 10-MHz Bandwidth, Continuous-Time ΣΔ ADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.

Temporiti, E. et al., "A 700kHz Bandwith ΣΔ Fractional Synthesizer with Spurs Compensation and Linearization Techniques for WCDMA Applications," IEEE Journal of Solid-State Circuits, vol. 39, No. 9, Sep. 2004, pp. 1446-1454.

* cited by examiner

SPUR CANCELLATION WITH ADAPTIVE FREQUENCY TRACKING

BACKGROUND

Field of the Invention

This invention relates to spur cancellation and more particularly to tracking spur frequency changes.

Description of the Related Art

Signals generated by phase-locked loops and other timing circuits can include undesirable spurious tones. Canceling these spurious tones can improve the output of the timing circuits. Accordingly, improved techniques for canceling spurious tones are desirable.

SUMMARY OF EMBODIMENTS OF THE INVENTION

In one embodiment, a method for tracking spur frequency includes extracting phase information from parameters used in determining a spur cancellation signal and updating a target spur frequency to an updated target spur frequency based on the phase information.

In another embodiment, an apparatus includes a spur cancellation circuit coupled to receive a target spur frequency indicative of a frequency of a spur to be canceled and supply a spur cancellation signal based on the frequency. A frequency tracking circuit tracks a change in the frequency of the spur to be canceled based on a change in phase of the spur cancellation signal and updates the frequency control word based on the change in the frequency of the spur.

In another embodiment a method includes applying a spur cancellation signal to cancel a spur at a first frequency. The method further includes tracking a frequency change in the spur based on a change in phase of the spur cancellation signal, the change in phase of the cancellation signal responsive to the frequency change of the spur. The first frequency of the spur cancellation signal is updated to a second frequency based on the tracking.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein relate to a spur, or tone, cancellation system or circuit such as one incorporated in a high-performance fractional-N highly-digital phase-locked loop (PLL). One such PLL is described in U.S. Pat. No. 9,762,250, entitled "Cancellation of Spurious Tones Within A Phase-Locked Loop With A Time-To-Digital Converter", filed Jul. 31, 2014, naming Michael H. Perrott as inventor, which application is incorporated herein by reference.

Figure 1:
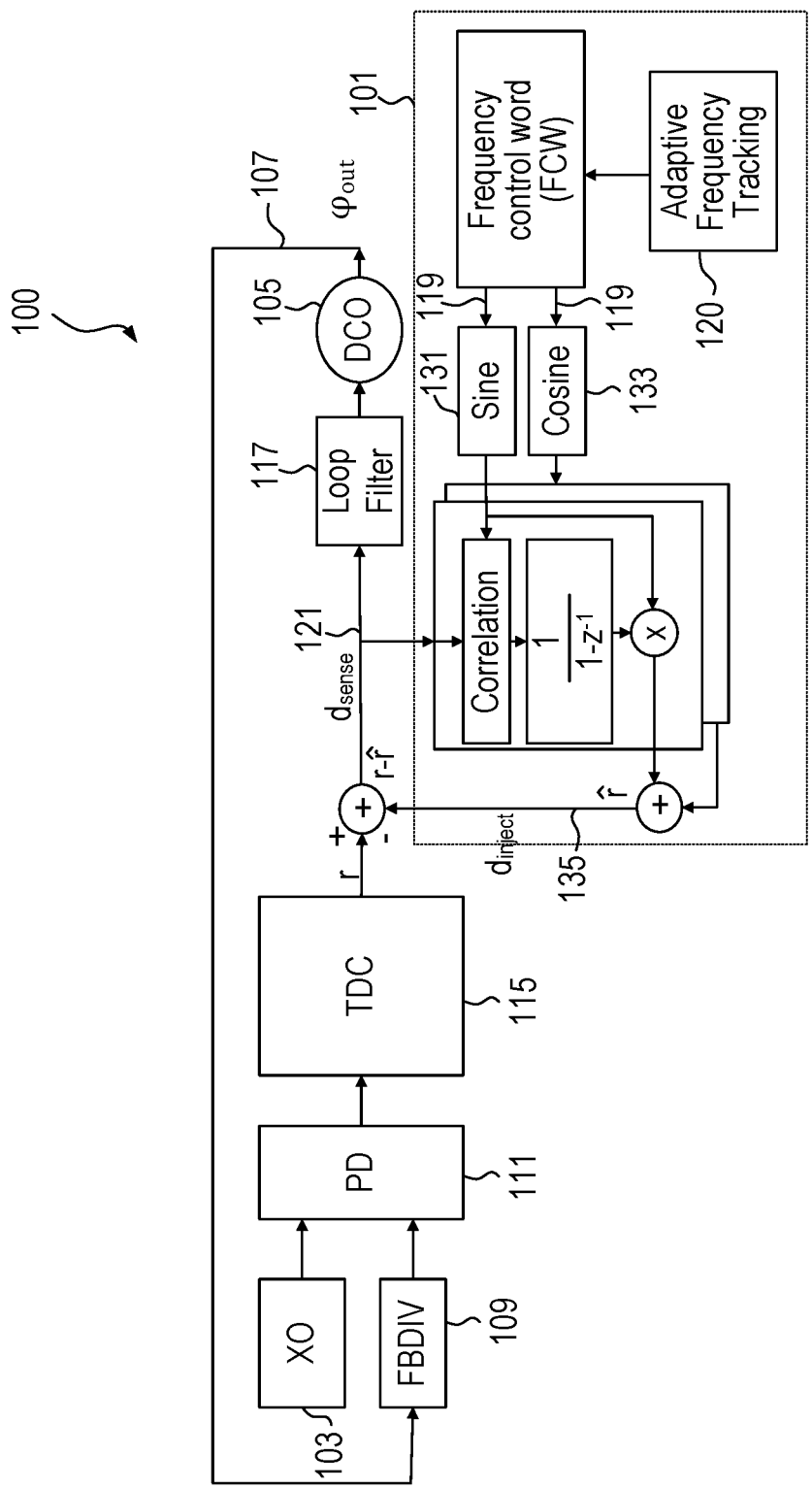
FIG. 1 illustrates a high level block diagram of a spur cancellation circuit with a spur frequency tracking circuit.

FIG. 1 illustrates a high level block diagram of an embodiment of a PLL 100 with a spur cancellation circuit 101. The PLL 100 receives a reference clock signal from crystal oscillator (XO) or other clock source 103. A digitally controlled oscillator (DCO) 105 supplies an output signal 107, which is fed back through feedback divider 109 to the phase detector 111. The phase detector supplies a time to digital converter circuit 115, which supplies a signal r that has a spurious tone (spur) canceled by the spur cancellation circuit 101 before being supplied to the loop filter 117.

The spur cancellation circuit receives a programmable frequency control word (FCW) 119 that identifies the target spur of interest (target spur frequency) to be canceled. As described further herein, the FCW is modified by the use of adaptive frequency tracking circuit 120 to track movement in spur frequency over time. In the spur cancellation circuit 101, sine and cosine terms 131 and 133 at the programmable target frequency are correlated against a sense node, $d_{sense}$, 121 inside the PLL. The resulting error signals drive a pair of accumulators, which set the weights on the sine and cosine signals, producing a spur cancellation signal, $d_{inject}$ 135. Negative feedback drives the amplitude and phase of the cancellation signal to be such that no spur appears (or the spur is significantly reduced) in the PLL output signal 107.

Figure 2:
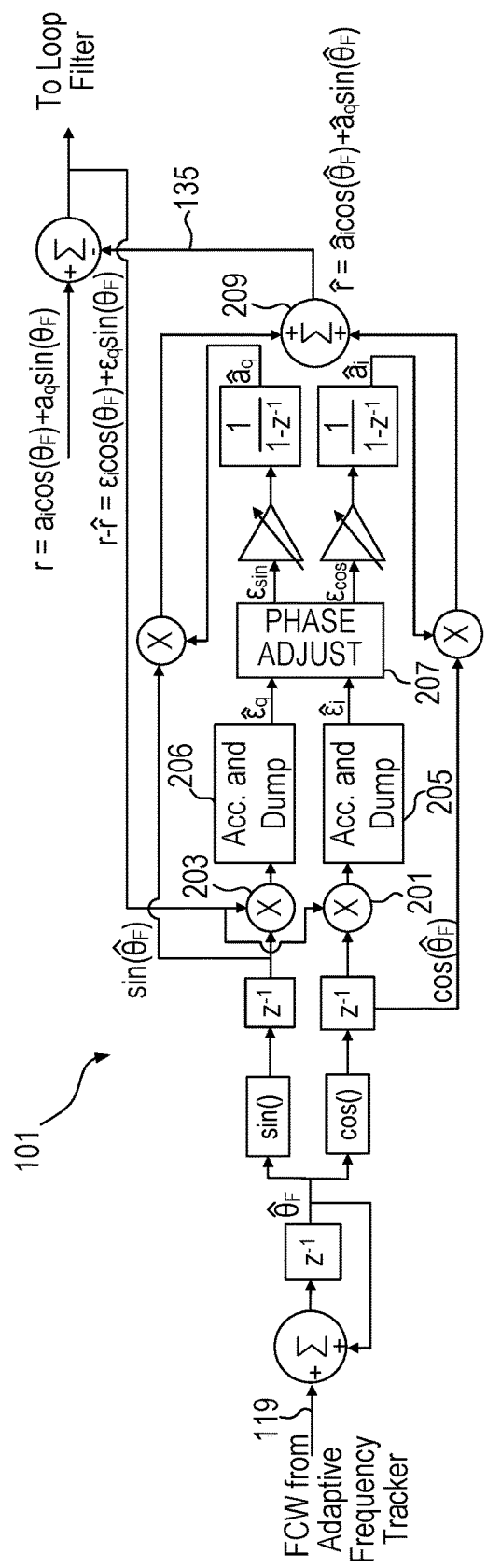
FIG. 2 illustrates additional details of the spur cancellation circuit.

FIG. 2 illustrates an embodiment of the spur cancellation circuit 101 in more detail. In the embodiment of FIG. 2, the two correlators are respectively implemented with high-resolution multipliers 201 and 203 and accumulate-and-dump circuits 205 and 206. The accumulate and dump circuits 205 and 206 average a number of samples by accumulating samples over the chosen measurement time frame (N samples) and then "dumping" the resulting value. A phase adjust block 207 follows the accumulate and dump circuits to compensate for PLL dynamics. The final weights on the sine and cosine terms are $\hat{a}_q$ and $\hat{a}_i$, which are the scale factors for the sine and cosine components of the cancellation signal. The weights multiply the sine and cosine terms (sin $\hat{\theta}_F$ and cos $\hat{\theta}_F$) and summer 209 sums together the multiplication results and supplies the spur cancellation signal $d_{inject}$ ($\hat{r}$ in FIG. 2) to cancel the spurious tone at the frequency specified by FCW. Note that the spur cancellation circuit can be implemented digitally.

In many applications the spur frequency tracks the spur cancellation circuit's main clock signal. However, in other applications such as jitter-attenuating clock applications with multiple asynchronous inputs or in the presence of an external interferer, the spur frequency does not track the spur cancellation circuit's main clock signal. In such situations, absent adaptive tracking of the spur frequency, the spur cancellation circuit does not accurately target the spur frequency resulting in a reduced quality of the spur cancellation. Further, multiple spurs may also diminish the quality of the spur cancellation. Embodiments described herein alleviate these issues by tracking the spur location directly and adapting the target frequency of the spur being canceled as the spur frequency changes.

Using the weights $\hat{a}_q$ and $\hat{a}_i$ for the sine and cosine components of the cancellation signal described above with relation to FIG. 2, the phase of the cancellation signal is equal to $$\phi[k] = \arctan\left(\frac{\hat{a}_q[k]}{\hat{a}_i[k]}\right),$$

where k is the sample index at the spur cancellation circuit clock rate. The difference in the phase from one sample to the next provides information about the difference between the actual spur frequency, $f_{spur}$, and the spur cancellation circuit target frequency, $f_{target}$. The relationship is expressed in the equation $\Delta\phi[k]=\phi[k]-\phi[k-1]=2\pi\cdot(f_{spur}[k]-f_{target}[k])$. If the actual spur frequency is higher than the targeted frequency, then the phase given by the weights will advance according to the difference. If the actual spur frequency is lower than the targeted frequency, then the phase given by the weights will retreat according to the difference. That assumes that the frequency difference is small enough that the spur cancellation circuit adaptive frequency tracking can track the difference, but this is a necessary condition for good cancellation, so it is valid to assume. Embodiments update the target frequency according to the equation $f_{target}[k+1]=f_{target}[k]+\mu\cdot(\phi[k]-\phi[k-1])$, where $\mu$ is a weighting factor that sets the rate at which the target frequency tracks the spur frequency. The same relationship can be expressed in the frequency domain as $$F_{target}(z) = \frac{\mu \cdot 2\pi z^{-1}}{1-(1-2\pi\mu)z^{-1}} F_{spur}(z).$$

The frequency domain equation shows that the DC gain is 1, with some lag given by the low-pass characteristic of the filter. The tracking rate set by $\mu$ is determined by the rate at which the spur frequency can change over time, the clock rate, and the rate at which it is desired to respond to variation of the spur frequency. The tracking rate is typically low, because it is tracking changes in spur frequency due to aging and environmental changes, which are gradual and slow compared to the high-speed operation of modern digital circuits. For example, the frequency change may be a maximum of 10,000 parts per million or 1% in embodiments due to temperature change. In other embodiments, that frequency change may be less.

Figure 3:
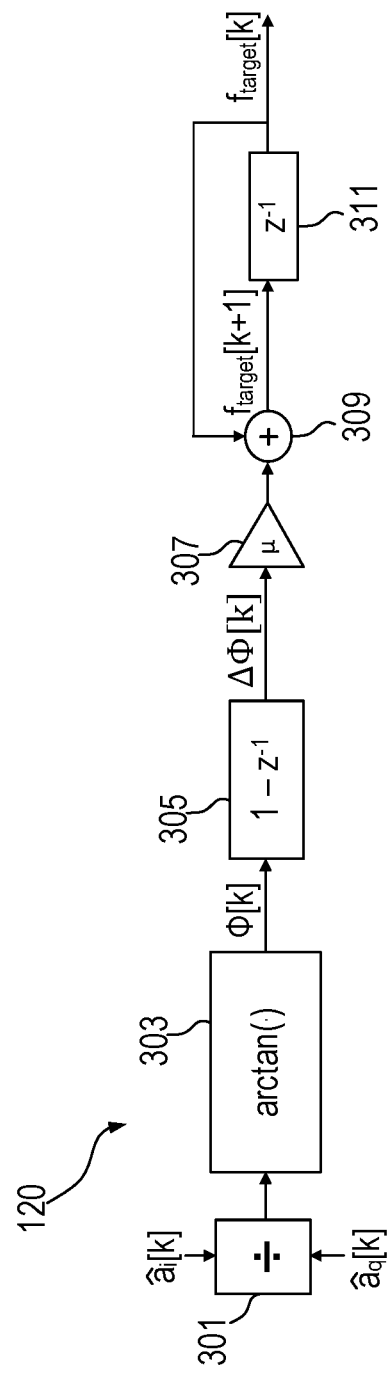
FIG. 3 illustrates a high level block diagram of an embodiment of an adaptive spur frequency tracking circuit.

FIG. 3 illustrates an embodiment of a hardware implementation of the adaptive frequency tracking circuit 120 shown in FIG. 1. A divider circuit 301 divides weight $\hat{a}_q$ by $\hat{a}_i$ and supplies the result to the arctan function 303, which supplies the phase $\phi[k]$ to the difference block 305. The difference block generates the phase difference $\Delta\phi[k]=\phi[k]-\phi[k-1]$ and supplies the phase difference to the scaling block 307, which scales the phase difference by a weighting factor $\mu$. Summer 309 adds the scaled phase difference $(\mu\cdot(\phi[k]-\phi[k-1]))$ to $f_{target}[k]$ to generate $f_{target}[k+1]$, which is supplied to the delay block 311. The frequency $f_{target}[k]$ is supplied as the frequency control word FCW to spur cancellation circuit. The initial spur frequency target may be loaded into the delay block 311 at power up or other reset condition. Note that if the phase difference is zero, the target spur frequency remains the same.

The embodiment illustrated in FIG. 3 assumes that the computation of the arctangent can be done within one clock cycle of the spur cancellation circuit. However, because the tracking rate for this loop is low, the loop can operate at a down-sampled rate in order to allow for efficient implementation. Thus, the arctangent function can take multiple clock cycles to complete, or use an iterative calculation method.

The spur adaptation circuit may use custom logic to implement the various functions described in FIG. 3. In other embodiments, a microcontroller may be used to implement some or all of the functionality illustrated in FIG. 3.

Figure 4:
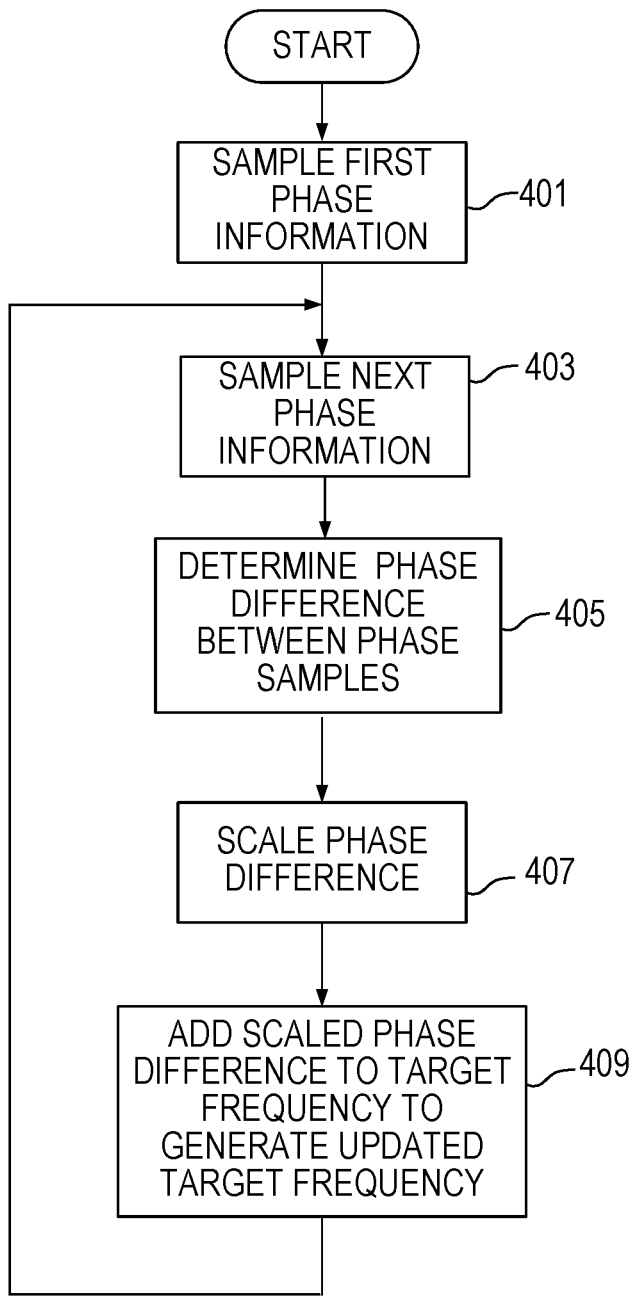
FIG. 4 illustrates a high level flow diagram showing operation of an embodiment of an adaptive spur frequency tracking circuit.

FIG. 4 illustrates a high level flow diagram of operation of an embodiment of adaptive frequency tracking for spur cancellation. In 401 first phase information is extracted from parameters specifying the cancellation signal. In 403 the next phase sample is taken. In the embodiment of FIGS. 1-3 the phase information is extracted from the weights assigned to the sine and cosine signals. More generally, the spur cancellation requirement is that a spur cancellation circuit cancels a periodic signal, which could be sinusoidal, as shown in the embodiments shown in FIGS. 1-3, but could also be, for example, a square wave or a triangle wave. The spur cancellation circuit cancels the periodic signal by injecting an opposite signal to cancel the spur. Thus, in other embodiments the same adaptive frequency tracking approach shown in FIG. 3 is applied to other spur or tone cancellation systems. The requisite phase information can be extracted from the parameters specifying the cancellation signal whether the signal is a sinusoid, square wave, triangular wave, or other periodic signal, and the phase information can then be used to update the target frequency. Once the first phase information is generated 401, the adaptive frequency tracking takes another phase sample in 403. In 405, the difference between two phase samples is determined and the difference is scaled in 407. The scaled phase difference is then added to the target frequency in 409 to generate an updated target frequency. If the phase has not changed, the updated target frequency is unchanged. The direction of the phase change determines whether the target frequency increases or decreases. The adaptive frequency tracking then returns to 403 to obtain the next phase sample and continues to track frequency changes of the spur signal.

Thus, various aspects have been described relating to tracking of the spur frequency. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method for tracking spur frequency comprising:
   generating a spur cancellation signal with a first phase using a target spur frequency;
   determining the first phase of the spur cancellation signal with the first phase from a first sample of parameters used in generating the spur cancellation signal with the first phase;
   generating the spur cancellation signal with a second phase;
   determining the second phase from a second sample of parameters used in determining the spur cancellation signal with the second phase;
   determining a phase difference between the first phase and the second phase;
   updating the target spur frequency to an updated target spur frequency based on the phase difference; and
   generating an updated spur cancellation signal using the updated target spur frequency.

2. The method as recited in claim 1 further comprising:
   scaling the phase difference and generating a scaled phase difference.

3. The method as recited in claim 2, further comprising:
adding the scaled phase difference to the target spur frequency to generate the updated target spur frequency.

4. The method as recited in claim 1, wherein the first sample of parameters used in determining the spur cancellation signal with the first phase includes a first sine weight and a first cosine weight and wherein the second sample of parameters used in determining the spur cancellation signal with the second phase includes a second sine weight and a second cosine weight.

5. The method as recited in claim 1, further comprising:
generating a first sine weight applied to a sine signal and a first cosine weight applied to a cosine signal as part of generating the spur cancellation signal with the first phase at a first time;
generating a second sine weight and a second cosine weight as part of generating the spur cancellation signal with the second phase at a second time; and
using the first sine weight and the first cosine weight to determine the first phase and using the second sine weight and the second cosine weight to determine the second phase, the first sine weight and the first cosine weight being the first sample of parameters and the second sine weight and the second cosine weight being the second sample of parameters.

6. The method as recited in claim 1 wherein the spur cancellation signal is a sinusoid.

7. The method as recited in claim 1 wherein the spur cancellation signal is other than a sinusoid.

8. The method as recited in claim 1 further comprising cancelling a spur in a phase-locked loop using the updated target spur frequency.

9. An apparatus comprising:
a spur cancellation circuit coupled to receive a target spur frequency indicative of a frequency of a spur to be canceled and supply a spur cancellation signal based on the target spur frequency; and
a frequency tracker to track a change in the frequency of the spur to be canceled, the frequency tracker including,
a phase determination block configured to divide a first sine weight used to generate a first sine component of the spur cancellation signal by a first cosine weight used to generate a first cosine component of the spur cancellation signal and generate a first divide value and wherein the first sine component and the first cosine component are summed to generate the spur cancellation signal with a first phase in the spur cancellation circuit, and wherein the first phase is determined in the phase determination block according to an arctangent of the first divide value;
wherein the phase determination block is further configured to divide a second sine weight used to generate a second sine component of the spur cancellation signal by a second cosine weight used to generate a second cosine component of the spur cancellation signal and generate a second divide value and wherein the second sine component and the second cosine component are summed to generate the spur cancellation signal with a second phase in the spur cancellation circuit, and wherein the second phase is determined in the phase determination block according to an arctangent of the second divide value;
a difference block to determine a phase difference between the first phase of the spur cancellation signal and the second phase of the spur cancellation signal; and
wherein the frequency tracker is configured to adjust the target spur frequency to an updated target spur frequency based on the phase difference.

10. The apparatus as recited in claim 9 wherein the frequency further comprises:
a scale circuit to adjust the phase difference by a scale factor and generate a scaled phase difference; and
a summing circuit to add the scaled phase difference to the target spur frequency to generate the updated target spur frequency.

11. The apparatus as recited in claim 10, wherein the frequency tracker further comprises:
a delay circuit coupled to the summing circuit to delay the updated target spur frequency.

12. The apparatus as recited in claim 9, wherein the spur cancellation circuit further comprises:
a summing circuit to sum the first sine component and the first cosine component to generate the spur cancellation signal with the first phase.

13. The apparatus as recited in claim 9 wherein the spur cancellation signal is a sinusoid.

14. The apparatus as recited in claim 9 further comprising:
a phase-locked loop generating a loop filter input signal in which the spur has been attenuated by the spur cancellation signal.

15. A method comprising:
using a sum of a sine component and a cosine component to generate a spur cancellation signal;
using a first weight applied to a sine signal to generate the sine component and a second weight applied to a cosine signal to generate the cosine component;
applying the spur cancellation signal to cancel a spur at a first frequency;
determining a first phase of the spur cancellation signal using the first and second weights;
using an updated first weight to generate an updated sine component of the spur cancellation signal and using an updated second weight to generate an updated cosine component of the spur cancellation signal;
determining a second phase of the spur cancellation signal using the updated first weight and the updated second weight;
generating a phase difference based on a difference between the first phase and the second phase;
tracking a frequency change of the spur based on the phase difference; and
updating the first frequency of the spur cancellation signal to a second frequency based on the tracking.

16. The method as recited in claim 15 wherein the spur cancellation signal is a sinusoid.

* * * * *